United States Patent [19]
Doty

[11] Patent Number: 5,162,739
[45] Date of Patent: Nov. 10, 1992

[54] BALANCED MULTI-TUNED HIGH-POWER BROADBAND COIL FOR NMR

[75] Inventor: F. David Doty, 600 Clemson Rd., Columbia, S.C. 29223-4300

[73] Assignee: F. David Doty, Columbia, S.C.

[21] Appl. No.: 681,104

[22] Filed: Apr. 5, 1991

[51] Int. Cl.$^5$ ............................................. G01R 33/20
[52] U.S. Cl. ..................................... 324/322; 324/314
[58] Field of Search .............. 324/322, 318, 313, 314, 324/307, 300, 309; 128/653.2, 653.5

[56] References Cited

U.S. PATENT DOCUMENTS

| | | | |
|---|---|---|---|
| 4,446,431 | 5/1984 | McKay | 324/300 |
| 4,456,882 | 6/1984 | Doty | 324/321 |
| 4,463,328 | 7/1984 | Doty | 324/322 |
| 4,641,098 | 2/1987 | Doty | 324/322 |
| 4,648,405 | 3/1987 | Keren | 324/313 |
| 4,710,719 | 12/1987 | Doty | 324/322 |
| 4,742,304 | 5/1988 | Schnall et al. | 324/322 |
| 4,833,412 | 5/1988 | Zens | 324/322 |
| 4,916,398 | 5/1990 | Rath | 324/322 |
| 4,916,418 | 4/1990 | Rath | 324/318 |
| 5,038,105 | 8/1991 | Codrington et al. | 324/318 |

OTHER PUBLICATIONS

V. R. Cross, R. K. Hester, and J. S. Waugh, *Rev. Sci. Instrum.*, vol. 47, "Single Coil Probe with Transmission-Line Tuning for Nuclear Magnetic Double Resonance", p. 1486 (1976).

D. I. Hoult, *Prog. in NMR Spect.*, vol. 12, "The NMR Receiver: A Description and Analysis of Design", p. 41 (1978).

F. D. Doty, R. R. Inners, and P. D. Ellis, *J. Mag. Res.*, vol. 43, "A Multinuclear Double Tuned Probe for Applications with Solids or Liquids Utilizing Lumped Tuning Elements", p. 399 (1981).

F. D. Doty, T. J. Connick, X. Z. Ni, and M. N. Clingan, *J. Mag. Res.*, vol. 77, "Noise in High Power, High Frequency Double Tuned Probes", p. 536 (1988).

*Primary Examiner*—Michael J. Tokar
*Assistant Examiner*—Raymond Y. Mah
*Attorney, Agent, or Firm*—Brumbaugh, Graves, Donohue & Raymond

[57] ABSTRACT

A double-tuned NMR sample excitation coil has a first end connected through a first balancing inductor to ground and a second end connected through a second balancing inductor to a low-frequency (LF) capacitor tuning and matching network. Two two balancing inductors have inductance less than 50% but greater than 10% that of the excitation coil. Each balancing coil is tuned by a capacitor network to an independent resonant frequency when disconnected from the sample coil that is less than 95% but greater than 60% of the final high frequency (HF) resonance. Moreover, both such independent resonant frequencies are equal within 10%. Broadband operation is possible under a variety of temperatures and the circuit works with high-speed sample spinners.

10 Claims, 3 Drawing Sheets

BALANCED MULTI-TUNED HIGH-POWER BROADBAND COIL FOR NMR

BACKGROUND OF THE INVENTION

The field of this invention is the measurement of nuclear magnetic resonance (NMR) for the purpose of determining molecular or microscopic structure, and, more particularly, a multi-resonant circuit for NMR measurements requiring simultaneous high-power excitation of a plurality of nuclides.

The NMR spectroscopist often finds it necessary to observe a wide variety of nuclides, especially $^{13}C$, $^{1}H$, $^{19}F$, $^{27}Al$, $^{29}Si$, $^{2}H$, and $^{15}N$ in the study of commercially and scientifically important chemicals. It is often desirable for the NMR circuit to be able to tune to two or more frequencies simultaneously. The most common example is irradiating at the proton ($^{1}H$) high frequency (HF) resonance to decouple its dipolar broadening effects while observing Bloch decays on a nuclide of lower magnetogyric ratio such as $^{13}C$ at a low frequency (LF). Other examples include cross-polarization and inverse detection.

For experiments on solid samples at high static magnetic field $B_o$ (greater than 6 T), where large RF fields $B_1$ (greater than 0.6 mT) are required, typical voltages across the sample coil (also called the excitation coil) are 2–6 kV. In U.S. Pat. No. 4,710,719, I disclose an efficient method of achieving broadband tuning of a single-tuned circuit or of the lower frequency channel of the standard double-tuned, high-power circuit for narrow-bore magnets. In "Noise in High Power, High Frequency Double Tuned Probes," *J. Mag. Res. Vol.* 77, p. 536 (1988), by F. D. Doty, T. J. Connick, X. Z. Ni, and M. N. Clingan, the authors discuss the various requirements for a high-performance, high-field, double-tuned solids probe for NMR with the standard MAS circuit as depicted in FIG. 1. This circuit has been found to have a practical (marginally acceptable reliability) upper limit proton $B_1$ of about 1.4 mT at 400 MHz for a 7 mm sample spinner diameter—or 1.2 mT for high reliability. More information on typical spinner systems may be found in copending application 07/607,521 filed Nov. 1, 1990 and in references cited therein.

In U.S. Pat. No. 4,833,412, Zens discloses a method of double tuning a balanced saddle coil for fixed-frequency high resolution experiments. The proton $B_1$ reported therein is about 0.23 mT (26 μs 90° pulse length), although it appears likely that his approach could be extended to 0.5 mT on small volumes. However, the enormous stray capacitance associated with his quarter-wavelength technique imposes severe limits on broadband tuning. (A balanced coil is one which is virtually grounded at its center.)

In U.S. Pat. No. 4,742,304, Schnall et al. disclose a method of double tuning that does not achieve balance and results in poor LF efficiency when sample losses are small—as is the case for most solids NMR experiments. It too affords limited broadband tuning capability. The same is true of the technique disclosed by McKay in U.S. Pat. No. 4,446,431.

In some cases (e.g., high density polymers) it is desirable to achieve 2 mT proton $B_1$ at 400 MHz with high reliability in double-resonance circuits. This requires smaller sample spinners (4–5 mm) with prior art circuits, and hence gives lower sensitivity. In other cases, it would be desirable to achieve 1.2 mT, 300 MHz proton $B_1$ with 14 mm sample spinners. In all double-tuned NMR circuits, it is desirable to reduce the shot noise associated with ground loops through high resistance contacts in the probe structure and to minimize other sources of signal degradation, including low filling factor, low efficiency, and low Q. It is also often desirable to obtain broadband operation, variable temperature operation, and high-speed sample spinning. The above combined performance objectives have been well beyond the capability of available circuits because of high voltage breakdown, limited tuning range from parasitic capacitance and inductance, or poor efficiency. The instant invention satisfies the above objectives.

It is well known that an electrically balanced circuit results in reduced radiation, lower voltages with respect to ground, and reduced sample losses. The double-tuned circuit shown in FIG. 2 has been widely used in fixed-frequency, low-power (typically under 300 V across the coils), high-resolution probes for liquid NMR samples for nearly two decades. It may be balanced at the HF by proper tuning. (Strictly speaking, it is a triple-resonance circuit, as it has three distinguishable inductors and more than three distinguishable capacitors. However, only two modes, the lowest and the highest distinguishable, result in substantial current through the central coil L1 when the 10 circuit is balanced. Hence, it is commonly referred to as a double-resonance circuit.) The instant invention discloses an improvement of this circuit such that HF balance is maintained while permitting (1) high-power operation (typically 2–6 kV), (2) broadband tuning of the LF mode, and (3) high efficiency at both (useful) frequencies.

SUMMARY OF THE INVENTION

A double-tuned NMR sample excitation coil has a first end connected through a first balancing inductor to ground and a second end connected through a second balancing inductor to a low-frequency (LF) capacitor tuning and matching network. The two balancing inductors each have inductance less than 50% but greater than 10% that of the excitation coil. Each balancing inductor (or balancing coil) is tuned by a capacitor network to an independent resonant frequency when disconnected from the sample coil that is less than 95% but greater than 60% of the final high frequency (HF) resonance. Moreover, both such independent resonant frequencies are equal within 10%. The excitation coil has inductance, stray capacitance, and optional added parallel capacitance such that its self resonance is greater than 110% of the desired HF. The total parasitic series inductance in the LF mode is typically less than 30 nH. The second balancing coil is a solenoid with length-to-diameter ratio between 0.2 and 2, fewer than five turns, and lead lengths less than the coil diameter. The tuning and matching capacitor networks have RF voltage ratings greater than 1 kV.

BRIEF DESCRIPTION OF THE DRAWINGS

The exemplary embodiment will be described with respect to of which.

DETAILED DESCRIPTION OF THE PREFERRED EMBODIMENT

Figure 1:
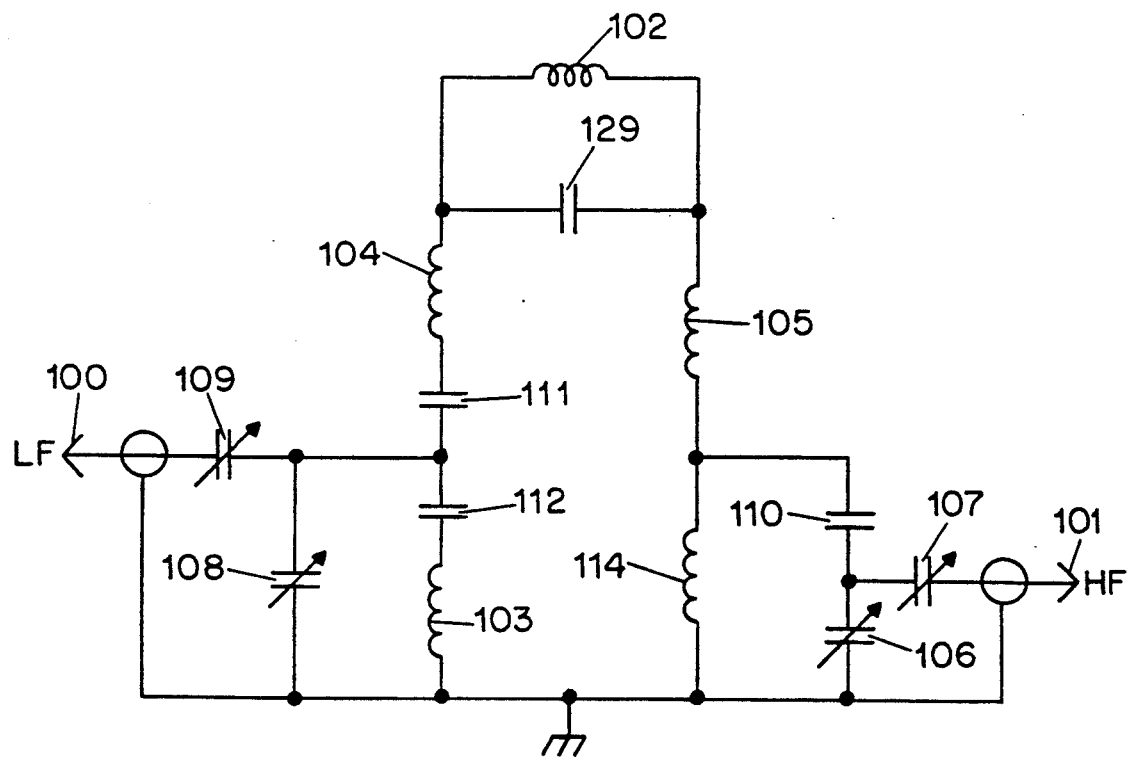
FIG. 1 is a schematic diagram of a prior art double-tuned, high-field, broadband solids NMR probe circuit with major parasitic inductances.

FIG. 1 illustrates a prior art high-power, broadband, double-tuned, high-field solids NMR probe circuit. The low frequency (LF) connection 100 may be seen as well as the high frequency (HF) connection 101 which are typically connected to 50 Ω transmission lines. Sample coil 102 is mechanically juxtaposed with the sample (not shown in FIG. 1) that is the subject of the NMR experiment. (In this and later circuits, the terms "sample coil" and "excitation coil" are used interchangeably.)

At the frequencies and power levels involved in high-power, high-field NMR such as that for which the present invention is intended, stray capacitances and inductances may not be ignored. For the circuit shown in FIG. 1, the three most significant parasitic lead inductances 103, 104, and 105 are shown explicitly. For the geometries required for typical spinner systems, minimum values of inductances 103, 104, and 105 are typically 10-15 nH each. Prior art designs have usually tuned the sample coil 102 to resonate near the desired HF so that isolation between the channels is improved. (As will be discussed further below, in an embodiment according to the instant invention the sample coil analogous to coil 102 resonates at a higher frequency.) The HF channel is tuned and matched by capacitors 106 and 107 respectively, which have typical voltage ratings of 500 V. The LF channel is tuned and matched by capacitors 108 and 109 respectively, which have typical voltage ratings of 2.4 kV. Higher voltages across the coils are accommodated by capacitive voltage division via capacitor 110 at the HF side, and capacitors 111 and 112 at the LF side. Capacitors 111 and 112 may be conveniently changed for broadband operation as disclosed by Doty in U.S. Pat. No. 4,710,719. Other prior art NMR probes utilize 5-kV variable capacitors for capacitors 108 and 109, where space permits, so as to simplify broadband tuning by eliminating the requirement of voltage division.

Figure 2:
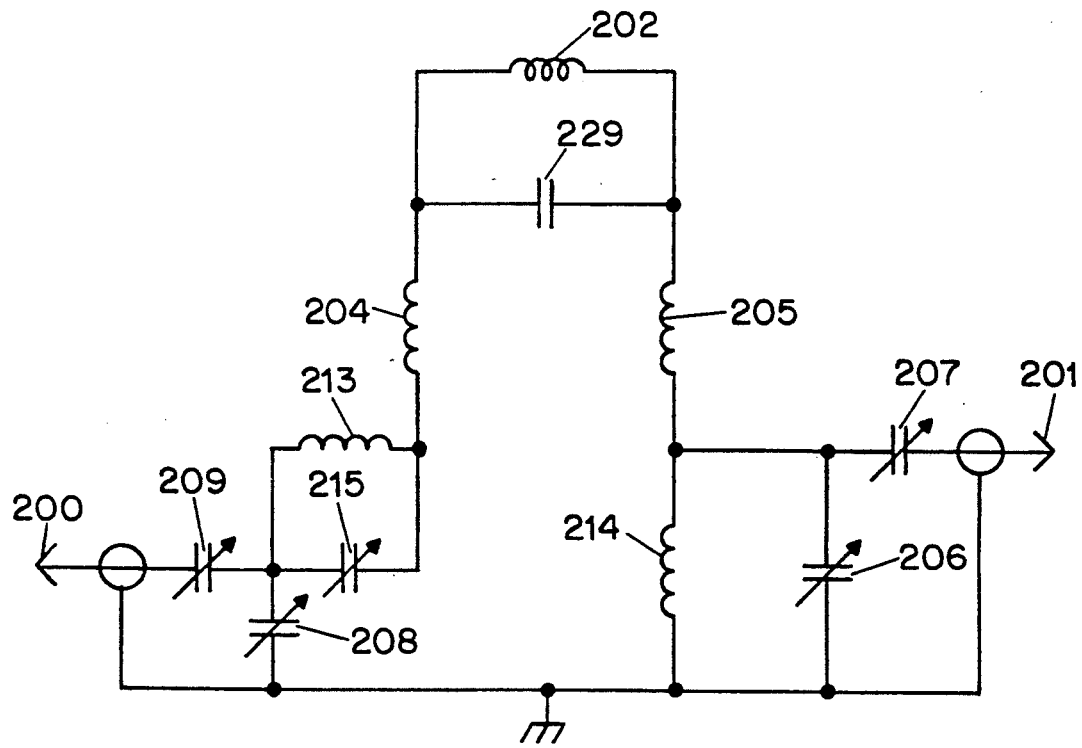
FIG. 2 is a schematic diagram of a prior art double-tuned, fixed-frequency proton-deuterium high resolution circuit.

FIG. 2 illustrates a prior art low-power, fixed-frequency, double-tuned, balanced NMR $^1$H/$^2$H coil circuit. Low frequency port 200 and high frequency port 201 are shown, coupled to sample coil 202. These elements correspond to the low frequency port 100, high frequency port 101, and sample coil 102 of the circuit of FIG. 1.

In the circuit of FIG. 2, the object is to achieve high HF ($^1$H) efficiency at the expense of poor LF ($^2$H) efficiency. Sample coil 202 is typically tuned for free resonance 10% above HF. The two significant parasitic lead inductances 204, 205 as shown explicitly are typically 20-30 nH each. They are often larger than inductor 202, which is itself often only 10-30 nH. The upper end of the LF tuning range is limited by the stray capacitance from the leads to ground and from coil 213 to ground. Balancing coils 214 and 213 typically have 2-4 times the inductance of coil 202. The maximum magnetic field $B_1$ associated with the low frequency is typically less than 0.1 mT, partly as a result of the limited LF efficiency, and partially as a result of the voltage limits of the capacitors that can be used in the prior art designs.

Figure 3:
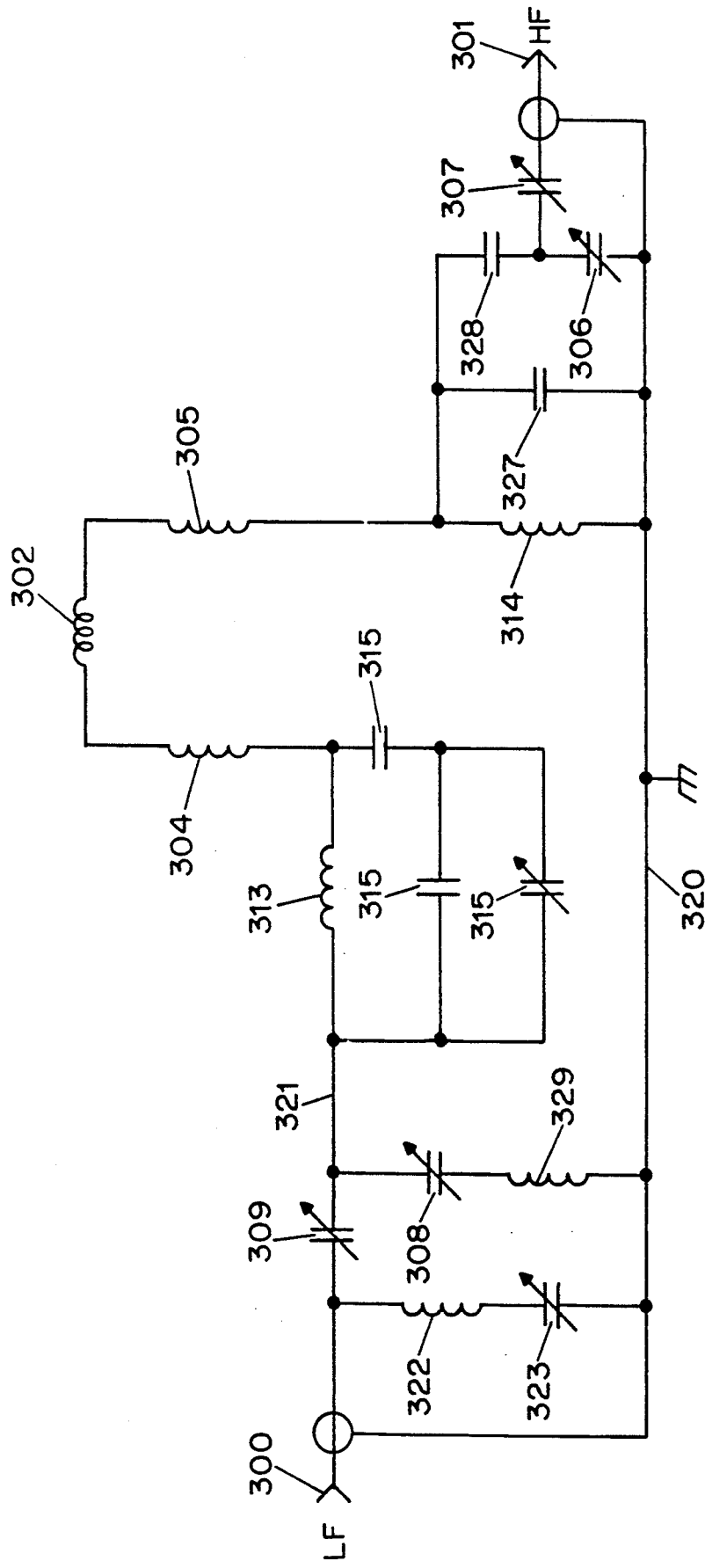
FIG. 3 is a schematic diagram of an embodiment of the balanced, broadband, high-field solids NMR circuit according to the invention.
Figure 4:
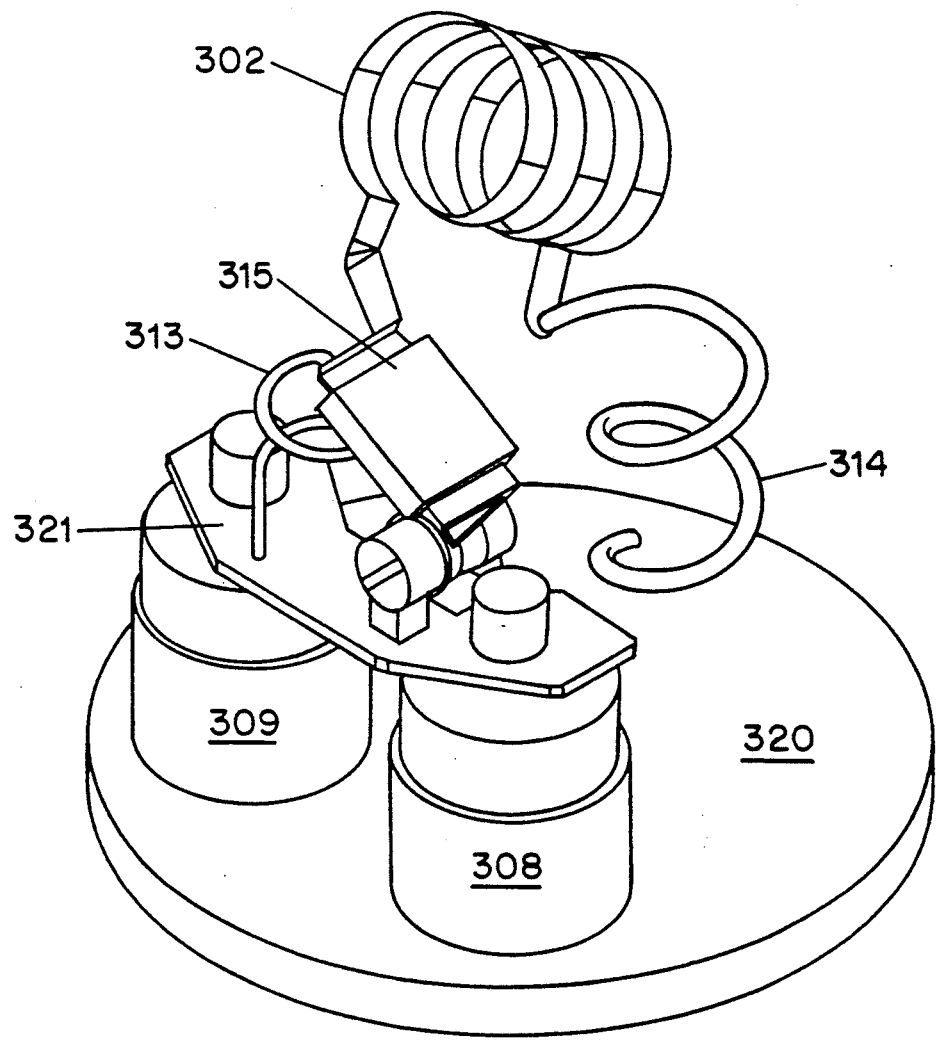
FIG. 4 is a perspective drawing showing the geometry of the balanced, high-field circuit of FIG. 3.

FIG. 3 shows an embodiment of the present invention in schematic form, and FIG. 4 shows the embodiment in perspective view; like elements have like reference designations. In FIG. 4, which shows part of an MAS (magic angle spinning) probe, the sample coil 302 is oriented at 54.7° with respect to the external magnetic field. The leads of the sample coil 302 are connected directly to the balancing coils 314 and 313. This permits minimizing parasitic lead inductance and stray capacitance as required for high efficiency and broadband tuning. Parasitic lead inductances shown explicitly in FIG. 3 as coils 304, 305 are typically reduced to less than 10 nH. The balancing coils 314, 313 are typically tuned to a free resonance about 20% below the desired HF so that the addition of coil 302 pulls the HF mode to the desired frequency. Consequently, considerable HF current flows through the LF capacitor network, and an HF trap is required on the LF port as shown, a series resonant trap of inductor 322 and variable capacitor 323.

Turning again to FIG. 4, sample coil 302, shown without the sample spinner apparatus, is typically 50-150 nH. The configuration of the present invention permits minimal length connections to the balancing coils 313, 314. The first HF balancing coil 314 is connected directly from the first lead of the sample coil to the ground plane 320. Broadband tuning of the low frequency is accomplished by capacitors 308, 309 which are preferably 1-45 pF, 5 kV, high-pressure-gas-filled variable capacitors. The connecting strap 321 between the LF tuning variable capacitor 308 and the LF matching variable capacitor 309 provides a convenient platform on which the second HF balancing coil 313 and its associated HF tuning capacitors 315 may be mounted. The HF tuning capacitors 306, 307 for the first balancing coil 314 are positioned close to coil 314, and are omitted from FIG. 4 for clarity. The HF trap 322, 323, also omitted from FIG. 4 for clarity, is located near the LF port 300. The low frequency range is further extended to lower frequencies by the typical (prior art) method for high-voltage plug-in capacitors, also not shown in FIG. 4 for clarity in parallel with capacitor 308. Turning again to FIG. 3, parasitic inductance associated with variable capacitor 308 is shown explicitly.

Figure 5:
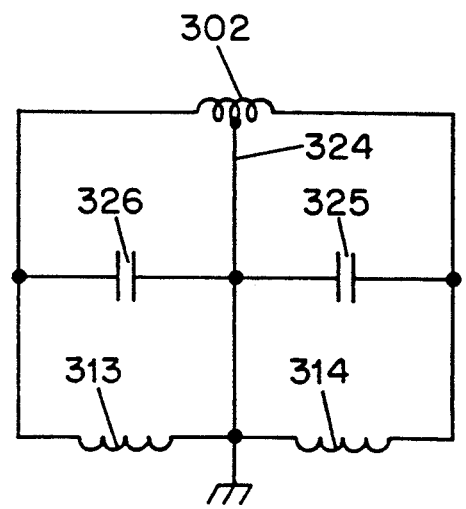
FIG. 5 is a simplified equivalent representation of the high frequency (HF) mode in the circuit of FIG. 3.

An essentially equivalent simplified representation of the balanced HF mode is shown schematically in FIG. 5. Note that sample coil 302 is shown with a virtual center a tap 324 which does not exist as a metallic conductor in the physical embodiment. Sample coil 302 appears in parallel with the series combination of inductors 314 and 313. Balance may be obtained for any combination of values of 314 and 313 such than the reactance of the circuit of coil 314 in parallel with equivalent capacitor 325 (and likewise coil 313 in parallel with equivalent capacitor 326) is equal to one-half the capacitive reactance necessary to resonate sample coil 302 at the desired high frequency. (Stray capacitance and any additional capacitance that may have been added across coil 302 or from coil 302 to ground must be properly considered along with capacitances 325 and 326). This mode is possible only if the high frequency employed in the experiment is about 95% or less of the self-resonant frequency of the excitation coil 302. Stated differently, this mode is possible only if, at the high frequency employed in the experiment, the excitation coil 302 is substantially inductive. Hence, coil 314 and coil 313 would each resonate at a frequency well below HF in the absence of coil 302. For conditions where the high frequency employed in the experiment is below 80% of the self-resonant frequency of the coil 302, under worst case conditions, some improvement may be obtained by adding capacitance in parallel with coil 302 so as to reduce HF current through the lead inductances 304 and 305 (shown explicitly in FIG. 3 but not shown in FIG. 5). The added capacitance would appear in FIG. 3 much like the capacitances 129 and 229 in FIGS. 1 and 2 respectively.

In the equivalent circuit of FIG. 5, capacitor 325 represents the combined capacitance of capacitors 327, 328, 306, and 307. (Due to the comparatively low impedance of port 301, for purposes of the equivalent circuit capacitors 306 and 307 are essentially in parallel.) Capacitor 326 represents the combined capacitance of capacitors 315. (At the high frequency, the series combination of capacitor 308 and inductor 329 is essentially negligible impedance.)

In practice, the inductances of coils 314 and 313 Will generally be between one-tenth and one-fourth the inductance of coil 302, so that LF efficiency does not suffer appreciably, but values as large as half the inductance of coil 302 will sometimes be appropriate where LF efficiency is less significant. Coil 314 may be a coaxial line approximately quarter-wave in length, but coil 313 must be a short solenoid to minimize stray capacitance for broadband capability on the LF and to minimize high voltage arcing problems at the low frequency. Coil 313 will typically be a two-turn solenoid with a length 70% of its diameter. The length-to-diameter ratio of coil 313 may be as small as 0.2 or as large as 2. Coil 313 will usually have two, three, or four turns for high-field solids NMR circuits. The inductance of coil 313 will generally be less than 25 nH but always less than 60 nH. Single-turn coils generally result in unacceptably high stray fields for coils 302, 313, and 314. However, coils 313 and 314 may be but a small fraction more than a single turn under certain conditions. Lead inductance 304 is typically 5 nH and lead inductance 305 is typically 10 nH.

In a 300 MHz MAS probe with a 14 mm zirconia rotor, the embodiment of the invention as shown in FIG. 3 shows great improvements over the prior art circuit of FIG. 1. The decoupling efficiency is seen to increase by more than a factor of three, and the maximum achievable proton magnetic field $B_1$ is seen to increase from less than 0.7 mT to 1.5 mT.

The embodiment as shown in FIG. 3 does present negative features: HF tuning is somewhat more complicated, and the LF efficiency is seen to be degraded by about 10%. These negative features are more than offset by the greatly enhanced HF performance.

Although this invention has been described herein with reference to specific embodiments, it will be recognized that changes and modifications may be made without departing from the spirit of the present invention. All such modifications and changes are intended to be included within the scope of the following claims.

I claim:

1. A balanced, multi-tuned, broad and circuit for high-field solids NMR probes requiring high-frequency port carrying a signal of a high frequency and a low-frequency port carrying a low frequency, said multi-tuned circuit comprising:

a multi-turn sample excitation coil with a first lead at a first end and a second lead at a second end;

a first balancing inductor connected with low first-lead inductance between said first end of said excitation coil and ground, said first end of said excitation coil also coupled to said high-frequency port via a fist high frequency high voltage variable capacitor network;

a low-frequency high-voltage tuning and matching capacitor network coupled to said low-frequency port;

a second balancing inductor and second high frequency high voltage variable capacitor network connected with low second-lead inductance between said second end of said excitation coil and said low-frequency high-voltage tuning and matching capacitor network;

said first and second balancing inductors each having inductance less than 50% but greater than 10% of that of said excitation coil;

said second balancing inductor further comprising a solenoid with fewer than five turns and having inductance less than 60 nH;

each of said balancing coils tuned to substantially equal values of capacitive reactance at the desired high frequency by said first and second high frequency high voltage variable capacitor networks; said excitation coil further characterized in having its self-resonant frequency greater than 110% of said high frequency.

2. The multi-tuned circuit of claim 1 wherein said second balancing inductor is further characterized in having a length-to-diameter ratio greater than 0.2 and less than 2.0.

3. The multi-tuned circuit of claim 1 wherein each of said first and second balancing inductors is turned to resonate, when disconnected from the excitation coil, at a frequency less than 95% of the high frequency.

4. The multi-tuned circuit of claim 1 wherein said low-frequency high-voltage tuning and matching capacitor network comprises at least one high-pressure-gas-filled variable capacitor.

5. The multi-tuned circuit of claim 1 wherein said first balancing inductor is further characterized as comprising a coaxial line having a length approximately one fourth of the high frequency wavelength.

6. The multi-tuned circuit of claim 1 further comprising a series high-frequency trap coupled to the low-frequency port.

7. The multi-tuned circuit of claim 1 wherein each of said first and second balancing inductors has inductance less than 25% of that of said excitation coil.

8. The multi-tuned circuit of claim 2 further characterized in that the length-to-diameter ratio of said second balancing inductor is about 0.7 and the number of turns is two.

9. The multi-tuned circuit of claim 1 wherein said second balancing inductor has a number of turns no fewer than two and no greater than four.

10. The multi-tuned circuit of claim 1 wherein said second balancing inductor has an inductance of less than 25 nH.

* * * * *

UNITED STATES PATENT AND TRADEMARK OFFICE
CERTIFICATE OF CORRECTION

PATENT NO. : 5,162,739
DATED : November 10, 1992
INVENTOR(S) : Doty

It is certified that error appears in the above-identified patent and that said Letters Patent is hereby corrected as shown below:

On cover page, change the issue date on Rath reference no. 4,916,398 from 5/1990 to read 4/1990.
Col. 1, line 13, "Wide" should read --wide--;
Col. 2, line 62, "to" should read --to drawings--.
Col. 3, line 13, "seen" should read --seen in Fig. 1,--.
Col. 4, line 45, "inductance" should read --inductance 329--.
Col. 4, line 50, "center a tap" should read --center tap--.
Col. 5, line 21, "Will" should read --will--.
Col. 5, line 63, "broad and" should read --broadband--.
Col. 5, line 64, "requiring" should read --requiring a--.
Col. 6, line 9, "fist" should read --first--.
Col. 6, line 38, "turned" should read --tuned--.

Signed and Sealed this

Seventh Day of December, 1993

Attest:

BRUCE LEHMAN

Attesting Officer

Commissioner of Patents and Trademarks